(12) United States Patent
Chang

(10) Patent No.: US 8,013,773 B2
(45) Date of Patent: Sep. 6, 2011

(54) RAIL TO RAIL FLASH

(75) Inventor: Simon Chang, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 12/513,769

(22) PCT Filed: Nov. 6, 2007

(86) PCT No.: PCT/GB2007/004221
§ 371 (c)(1),
(2), (4) Date: Nov. 9, 2009

(87) PCT Pub. No.: WO2008/056124
PCT Pub. Date: May 15, 2008

(65) Prior Publication Data
US 2010/0060501 A1    Mar. 11, 2010

(30) Foreign Application Priority Data
Nov. 7, 2006   (GB) .................................. 0622199.8

(51) Int. Cl.
*H03M 1/36*   (2006.01)
(52) U.S. Cl. ........................................ 341/159; 341/155
(58) Field of Classification Search .................. 341/159, 341/158, 155, 161
See application file for complete search history.

(56) References Cited

U.S. PATENT DOCUMENTS

| 5,093,664 | A | * | 3/1992 | Senn et al. ..................... 341/156 |
| 5,345,234 | A | * | 9/1994 | Stewart et al. ................. 341/108 |
| 6,011,503 | A | * | 1/2000 | Lee ............................... 341/159 |
| 6,373,423 | B1 | | 4/2002 | Knudsen |
| 6,437,724 | B1 | * | 8/2002 | Nagaraj ......................... 341/159 |
| 2003/0043066 | A1 | | 3/2003 | Otsuka |

FOREIGN PATENT DOCUMENTS

JP    02-105632    4/1990

OTHER PUBLICATIONS

International Search Report for PCT/GB2007/004221.
Translated Abstract of Japanese Application Publication No. 02-105632, published Apr. 18, 1990, referenced in the International Search Report for PCT/GB2007/004221.
Written Opinion of the International Searching Authority for PCT/GB2007/004221.

* cited by examiner

*Primary Examiner* — Brian Young
(74) *Attorney, Agent, or Firm* — Greenberg Traurig, LLP

(57) ABSTRACT

An analog to digital converter comprising: a first set comprising nodes defined by circuitry such that each node is at a respective voltage, the voltages on the nodes being in an orderly progression between the voltage of a first current source and the voltage of a first input node; a second set comprising nodes defined by circuitry such that each node is at a respective voltage, the voltages on the nodes being in an orderly progression between the voltage of a second current source and the voltage of a second input node; a plurality of comparators, each comparator being arranged to compare the voltage on a node in the first set with the voltage on a respective node in the second set; and a pair of switching devices arranged between the first current source and the first set of nodes, the first switching device of the pair connected so as to supply the current from the first current source to all said nodes in the first set, and the second switching device of the pair connected so as to supply the current from the first current source to a subset of said nodes in the first set which are closest in voltage to the voltage of the first input node.

24 Claims, 9 Drawing Sheets

RAIL TO RAIL FLASH

CROSS REFERENCE TO RELATED APPLICATIONS

This application is a 35 U.S.C. §371 national phase application of PCT International Application No. PCT/GB2007/004221, filed 6 Nov. 2007, by applicant Cambridge Silicon Radio Limited, entitled "RAIL TO RAIL FLASH," which claims priority to United Kingdom Application No. GB 0622199.8, filed 7 Nov. 2006, each of the foregoing of which is incorporated herein by reference in its entirety.

BACKGROUND

This disclosure relates to analog to digital converters, in particular, to FLASH analog to digital converters having a wide input range.

FIG. 1 shows an example of a conventional "FLASH" or "direct conversion" analog to digital converter (ADC). The circuit employs a set of resistors 1 arranged in a chain between a reference voltage 3 and ground (or another reference voltage) to generate a series of voltages at the nodes 5 between the resistors. Typically the resistors all have the same resistance and the variation in voltage from one node to the next is a linear progression. A set of comparators 4 compares the voltage at each of the nodes to the input voltage 2: if the input voltage is higher than the node voltage at a comparator that comparator will saturate and output a '1', otherwise the comparator output will stay low. The comparators will therefore produce a sequence of '1's and '0's at the binary encoder 6 for a given input voltage, with the input voltage level being digitally represented by the point in the sequence at which the switch to '0's. In this manner the input voltage may be digitally sampled to an accuracy determined by the number of comparators (and hence bits).

Such a circuit design suffers from several problems. The accuracy of the ADC is highly dependent on the accuracy and stability of the reference voltage(s) and on the precision of the resistors. Furthermore, the design is susceptible to systematic offset effects in the comparators since all the comparators compare the input voltage to a node voltage dependent on the common reference voltage.

FIG. 2 shows a FLASH ADC having differential inputs. The circuit uses two chains of resistors 20, 29 to generate a series of voltages above the inputs 25, 31 at nodes 22, 32. A pair of current sources 24, 27 connected between voltage rail 28 and the two resistor chains define the voltage at the upper ends of the resistor chains. The comparators 33 are arranged such that the first comparator takes its first input from the first node in the first chain and its second input from the last node in the second chain, the second comparator takes its first input from the second node in the first chain and its second input from the penultimate node in the second chain, and so on, up to the last comparator, which takes its first input from the last node in the first chain and its second input from the first node in the second chain.

When the input voltages 25 and 31 are zero, the voltages at nodes 23 and 30 are equal and the output of comparator 26 is low. When input voltage 25 increases slightly relative to input voltage 31, the voltage at node 23 is higher than that the voltage at node 30 and the output of comparator 26 goes high. When the difference between input voltages 25 and 31 increases by the resolution of the ADC, the output of the next comparator in the series (i.e. one closer to the voltage inputs as shown in FIG. 2) will go high due to the voltage at its first input node being slightly higher than the voltage at its second input node. In this manner the input voltage may be encoded as a binary string, with the input voltage level being digitally represented by the point in the sequence at which the '1's switch to '0's. The binary string is typically encoded by a binary encoder to minimize the amount of redundant information. Thus, an ADC having 64 comparators will output a string of 6 bits. The number of bits is representative of the accuracy of the ADC.

FIG. 3 illustrates the input range of the ADC shown in FIG. 2. The input range is approximately half of the rail-to-rail voltage available to the ADC. This is because it is only possible for half of the comparators (those below comparator 26 in FIG. 2) to be at or close to their thresholds—and therefore relevant to the analog-to-digital conversion—when input voltage 25 is higher than input voltage 31. The other half are relevant when input voltage 25 is lower than input voltage 31.

The input voltage range is restricted by the fact that a constant current flows through the chain of resistors 20 and therefore the voltage dropped across the total length of the resistor chain is fixed. The highest input voltage that can be measured is less than the rail voltage 28 minus the total voltage dropped across the resistor chain. For optimum operation, the total voltage dropped across the resistor chain is set to be approximately half the available rail voltage. Thus at the highest measurable input voltage, the voltage at node 34 is slightly lower than the input voltage 25 and the output of the final comparator 19 in the series goes high.

The input range 36 is further limited by the fact that the current sources typically require a minimum voltage 38 across them in order to maintain the current at its predetermined level. Thus, there is a maximum voltage allowed at the output of the current source before the MOSFET (or other suitable transistor) controlling the current is driven into linear mode and the current (and hence the converter) will no longer be accurate. This voltage is $V_{DD}-E_P$, where $E_P$ is the drain-source voltage 38 required to keep the current source saturated and $V_{DD}$ is the rail voltage 35. At the bottom end, the input voltage is limited by how low the driving amplifier can pull the input voltage. Typically the driving amplifier cannot pull the input all the way down to ground. The minimum input voltage is designated by $E_N$, 39 in FIG. 3. The input range of the ADC shown in FIG. 2 is therefore at most $0.5*(V_{DD}-E_P-E_N)$.

The circles 37 in FIG. 3 represent the crossover points at the threshold of each bit value, i.e. each point corresponds to the voltage at which the output of a given comparator switches from low to high or vice versa. Note that the threshold voltage is the same for all the comparators.

The desire to reduce operating temperatures and increase the speed of digital electronics is pushing down the operating voltages of digital electronics. It is therefore becoming more important to make the most efficient use of the available voltage range in devices such as analog-to-digital converters. At lower voltage levels, the noise introduced by electronic components becomes more significant and, without careful design, lower tolerances are required of component values which generally increases the area of silicon required. There is therefore a need for an ADC having a large input voltage range (ideally rail-to-rail) and a high tolerance to internal offset voltages.

SUMMARY

According to a first aspect of the present disclosure there is provided an analog to digital converter comprising: a first set comprising nodes defined by circuitry such that each node is at a respective voltage, the voltages on the nodes being in an orderly progression between the voltage of a first current source and the voltage of a first input node; a second set comprising nodes defined by circuitry such that each node is at a respective voltage, the voltages on the nodes being in an orderly progression between the voltage of a second current source and the voltage of a second input node; a plurality of comparators, each comparator being arranged to compare the voltage on a node in the first set with the voltage on a respective node in the second set; and a pair of switching devices arranged between the first current source and the first set of nodes, the first switching device of the pair connected so as to supply the current from the first current source to all said nodes in the first set, and the second switching device of the pair connected so as to supply the current from the first current source to a subset of said nodes in the first set which are closest in voltage to the voltage of the first input node; wherein control voltages of the first and second switching devices of the pair are set such that: (a) when the potential difference between the voltage at the first current source and the voltage at the first input node is greater than a predetermined potential difference the first switching device is in a first state and the current from the first current source flows through the first switching device; and (b) when the potential difference between the voltage at the first current source and the voltage at the first input node is less than the predetermined potential difference the first switching device is in a second state and the current from the first current source flows through the second switching device.

Suitably the circuitry is arranged such that, in the absence of input voltages at the first and second input nodes, the voltages on the nodes in the first and second sets are in a linear progression. Suitably the circuitry is arranged such that, in the absence of input voltages at the first and second input nodes, the voltages on the nodes in the first and second sets are in a logarithmic progression.

Preferably the circuitry is arranged such that the first set of nodes form a chain of first nodes extending between the first current source and first input node and the second set of nodes form a chain of second nodes extending between the second current source and second input node, each pair of adjacent nodes in the first and second chains of nodes being interconnected by a set of one or more resistors. Suitably each set of one or more resistors interconnecting the pairs of adjacent nodes in the first and second chains of nodes has the same total nominal resistance.

Preferably the total nominal resistance of each set of one or more resistors and the target current level of the current sources and sinks are chosen so as to maximize the input voltage range of the analog to digital converter.

The analog to digital converter may further comprise: a second pair of switching devices arranged between the second current source and the second set of nodes, the first switching device of the pair connected so as to supply the current from the second current source to all said nodes in the second set, and the second switching device of the pair connected so as to supply the current from the second current source to a subset of said nodes in the second set closest in voltage to the voltage of the second input node; wherein the control voltages of the first and second switching devices of the second pair are such that: (a) when the potential difference between the voltage at the second current source and the voltage at the second input node is greater than a predetermined potential difference the first switching device is in a first state and the current from the second current source flows through the first switching device; (b) when the potential difference between the voltage at the second current source and the voltage at the second input node is less than the predetermined potential difference the first switching device is in a second state and the current from the second current source flows through the second switching device.

Suitably the control voltages are invariant during operation. Suitably the switching devices are transistors and the control voltages are gate voltages. Suitably the magnitude of the difference between the gate voltage of a first transistor of a pair and its threshold voltage is greater than the magnitude of the difference between the gate voltage of a second transistor of that pair and its threshold voltage.

The analog to digital converter may further comprise input circuitry arranged to provide first and second input voltages to the first and second input nodes. Suitably the input circuitry includes one or more driving amplifiers configured such that the first and second input voltages are substantially independent of the current provided to the first and second input nodes by the input circuitry. The first and second input voltages may be scaled so that the maximum and minimum input voltages are equal to the voltages delimiting the input voltage range of the analog to digital converter. The first and second input voltages may be biased such that the midpoint voltage between the two input voltages is maintained at the midpoint voltage between the upper and lower supply voltages supplied to the analog to digital converter.

The first and second input voltages may be a pair of differential input voltages. Alternatively, the first input voltage may be a single-ended input voltage and the second input voltage is synthesized from the first input voltage so as to maintain the midpoint voltage between the two input voltages at the midpoint voltage between the upper and lower supply voltages supplied to the analog to digital converter.

Preferably the first and second sets of nodes each have N nodes and a comparator having its first input connected to the node at position x in the first set has its second input connected to the respective node at position N+1−x in the second set, where x=1 at the nodes adjacent to the first and second current sources and x=N at the nodes adjacent to the first and second input nodes and the remaining nodes in each set are arranged in successive order therebetween.

According to a second aspect of the present disclosure there is provided an analog to digital converter having any combination of the features described above in which the first set of nodes further comprises a further set of first nodes defined by circuitry such that each node is at a respective voltage, the voltages on the further set of first nodes being in an orderly progression between the voltage of the first input node and the voltage of a first current sink; and the second set of nodes further comprises a further set of second nodes defined by circuitry such that each node is at a respective voltage, the voltages on the further set of second nodes being in an orderly progression between the voltage of the second input node and the voltage of a second current sink; the analog to digital converter further comprising: a third pair of switching devices arranged between the first current sink and the further set of first nodes, the first switching device of the pair connected so as to supply the current from the first current sink to all the nodes in the further set of first nodes, and the second switching device of the pair connected so as to supply the current from the first current sink to a subset of the nodes in the further set of first nodes which are closest in voltage to the voltage of the first input node; wherein the control voltages of the first and second switching devices of the third pair are such that: (a) when the potential difference between the voltage at the first current sink and the voltage at the first input node is greater than a predetermined potential difference the first switching device is in a first state and the current from the first current source flows through the first switching device;

and (b) when the potential difference between the voltage at the first current sink and the voltage at the first input node is less than the predetermined potential difference the first switching device is in a second state and the current from the first current source flows through the second switching device.

Preferably the analog to digital converter further comprises a comparator arranged to compare the voltage at the first input node with the voltage at the second input node.

Preferably the analog to digital converter further comprises: a fourth pair of switching devices arranged between the second current sink and the further set of second nodes, the first switching device of the pair connected so as to supply the current from the second current sink to all the nodes in the further set of second nodes, and the second switching device of the pair connected so as to supply the current from the second current sink to a subset of the nodes in the further set of second nodes which are closest in voltage to the voltage of the second input node; wherein the control voltages of the first and second switching devices of the fourth pair are such that: (a) when the potential difference between the voltage at the second current sink and the voltage at the second input node is greater than a predetermined potential difference the first transistor is in a first state and the current from the second current source flows through the first switching device; and (b) when the potential difference between the voltage at the second current sink and the voltage at the second input node is less than the predetermined potential difference the first transistor is in a second state and the current from the second current source flows through the second switching device.

Preferably the input voltage range is equal to the potential difference between the upper and lower supply voltages supplied to the analog to digital converter.

Preferably the first and second sets of nodes each have N nodes and the total number of comparators is N, each comparator having its first and second inputs connected such that a comparator having its first input connected to the node at position x in the first set has its second input connected to the node at position N+1−x in the second set, where x=1 at the nodes adjacent to the first and second current sources and x=N at the nodes adjacent to the first and second current sinks and the remaining nodes in each set are arranged in successive order therebetween.

According to a third aspect of the present disclosure there is provided an electronic device comprising an analog to digital converter having any combination of the features described above in relation to either the first or second aspect of the present disclosure.

According to a fourth aspect of the present disclosure there is provided an integrated circuit comprising an analog to digital converter having any combination of the features described above in relation to either the first or second aspect of the present disclosure.

BRIEF DESCRIPTION OF THE DRAWINGS

The present disclosure will now be described by way of example with reference to the accompanying drawings, in which.

DETAILED DESCRIPTION OF THE DRAWINGS

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Figure 4:
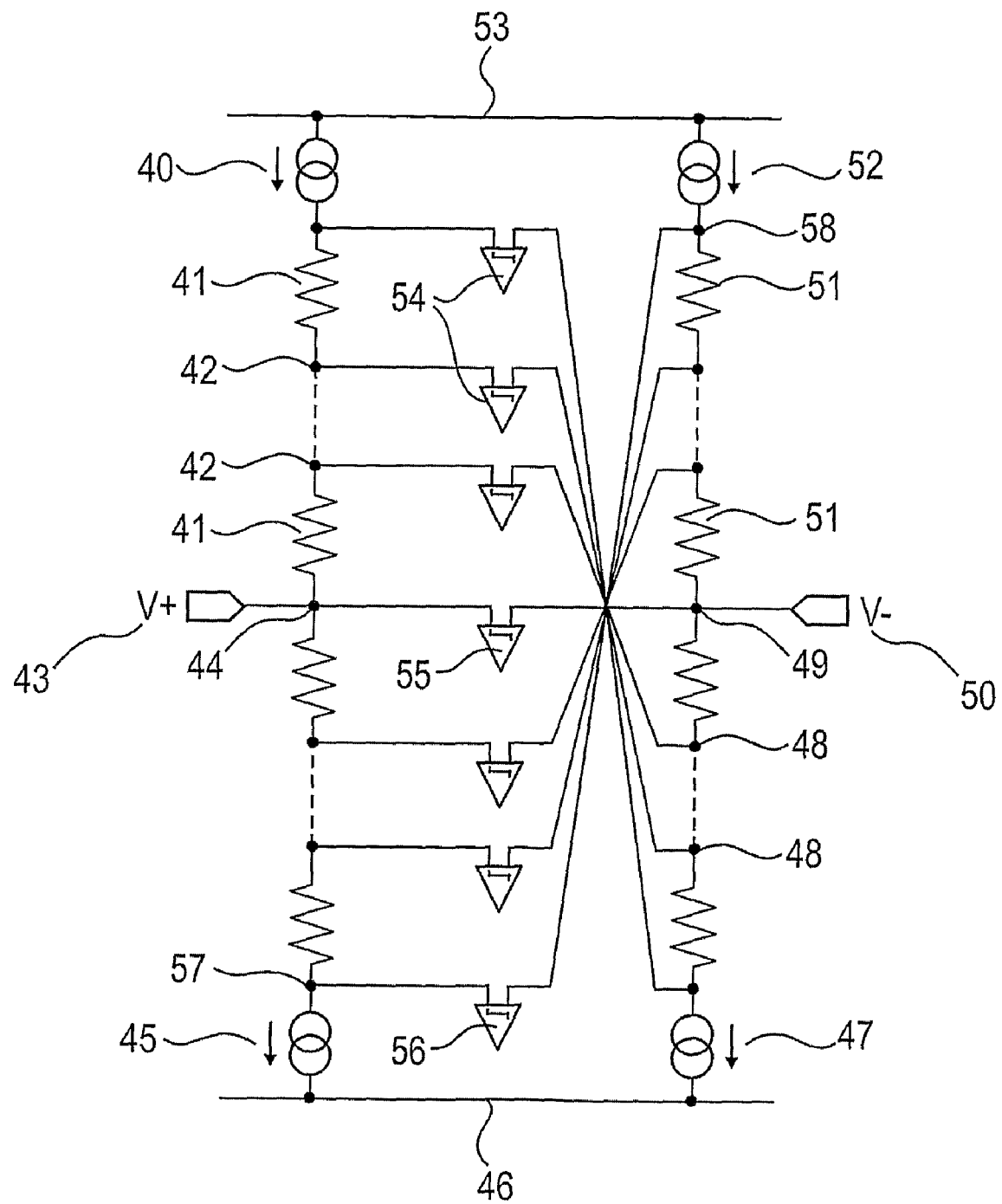
FIG. 4 is a circuit diagram of a FLASH ADC in accordance with a first embodiment of the present disclosure.

FIG. 4 shows a FLASH ADC circuit having differential inputs. The circuit may be implemented in a single integrated circuit. The circuit comprises two sets of nodes forming chains of nodes 42 and 48, each chain extending between the upper and lower voltage rails 53 and 46. In FIG. 4, adjacent nodes are separated by resistors 41 and 51, but the nodes may be separated by any suitable electronic components that generate a series of voltages at the nodes between the upper and lower voltage rails. The voltages dropped between adjacent nodes are termed "delta-voltages". The components may have some capacitance or inductance and the voltages at any given pair of nodes may or may not be in phase with each other.

All the resistors in the resistor sets 41 and 51 may have the same nominal resistance, in which case the delta-voltages are all equal and, in the absence of any inputs, the circuit generates a series of equally-spaced voltages at the nodes of each chain (i.e. there is a linear relationship between the position of a node in the chain and its voltage). Alternatively, the resistors within a set may have the same nominal resistance, but the two sets may contain resistors of different nominal resistances. Alternatively, the nominal resistances of the resistors in the two sets may be selected so as to define a logarithmic progression of voltages at the nodes of each chain. Alternatively, the resistances of the resistors in the two sets may be selected so as to define any other progression of voltages at the nodes of each chain.

Each chain of nodes has a current source 40, 52 between the upper end of the chain and the upper voltage rail, and a current sink 45, 47 between the lower end of the chain and the lower voltage rail. In a first embodiment (shown in FIG. 4), the first differential input 43 is connected at the midpoint node 44 of the first chain, the second differential input 50 is connected at the midpoint node 49 of the second chain, and the first and second chains have an equal number of nodes. This configuration requires there to be an odd number of nodes in each chain. However, there may be an unequal number of nodes in each chain, and the first differential input may be connected at any node of the first chain and the second differential input may be connected at any node of the second chain. In accordance with the present disclosure, the first and second differential inputs are connected such that there is at least one node between each input and the relevant current source and between each input and the relevant current sink.

The current sources and sinks may be of any design. Preferably they are each based around a MOSFET, but they may be based around any type of transistor. Suitably, input circuitry (not shown) provides the inputs to the ADC. The input circuitry preferably ensures that the input voltages lie within the range measurable by the ADC. Preferably the input circuitry includes one or more driving amplifiers that can provide a pair of input voltages to the ADC which are substantially independent of the current drawn/sunk by the ADC from/at its inputs across the input voltage range of the ADC.

The differential ADC inputs is preferably biased by the input circuitry such that the midpoint between the two input voltages is maintained at the midpoint voltage between the upper and lower voltage rails 46 and 53. This leads to the maximum input range for the ADC. Alternatively, the ADC inputs may not be true differential inputs and one of the ADC inputs may be synthesized from the signal for conversion so as to provide a pair of inputs. In this case, the synthesized ADC input is preferably chosen so as to maintain the midpoint between the two input voltages at the midpoint between the upper and lower voltage rails.

A set of comparators 54 compares the voltages at nodes of the first chain with the voltages at nodes of the second chain. In a preferred embodiment the nodes are configured as in the first embodiment described above, the number of comparators is equal to the number of nodes in each of the first and second chains and the comparators are configured as follows. The first comparator in the set takes its first input from the first node in the first chain and its second input from the last node in the second chain, the second comparator takes its first input from the second node in the first chain and its second input from the penultimate node in the second chain, and so on, up to the last comparator, which takes its first input from the last node in the first chain and its second input from the first node in the second chain.

In some embodiments, a similar cross-configuration of comparator inputs may be used with an even number of nodes in each of the first and second chains, and/or with an unequal number of first and second nodes (i.e. some comparator inputs share the same node). In some embodiments, the inputs are not connected at or close to the midpoints of the first and second chains. However, the greatest increase in the useable input voltage range over the ADC design shown in FIG. 2 occurs when the inputs are close to the midpoints of the first and second chains.

Figure 5:
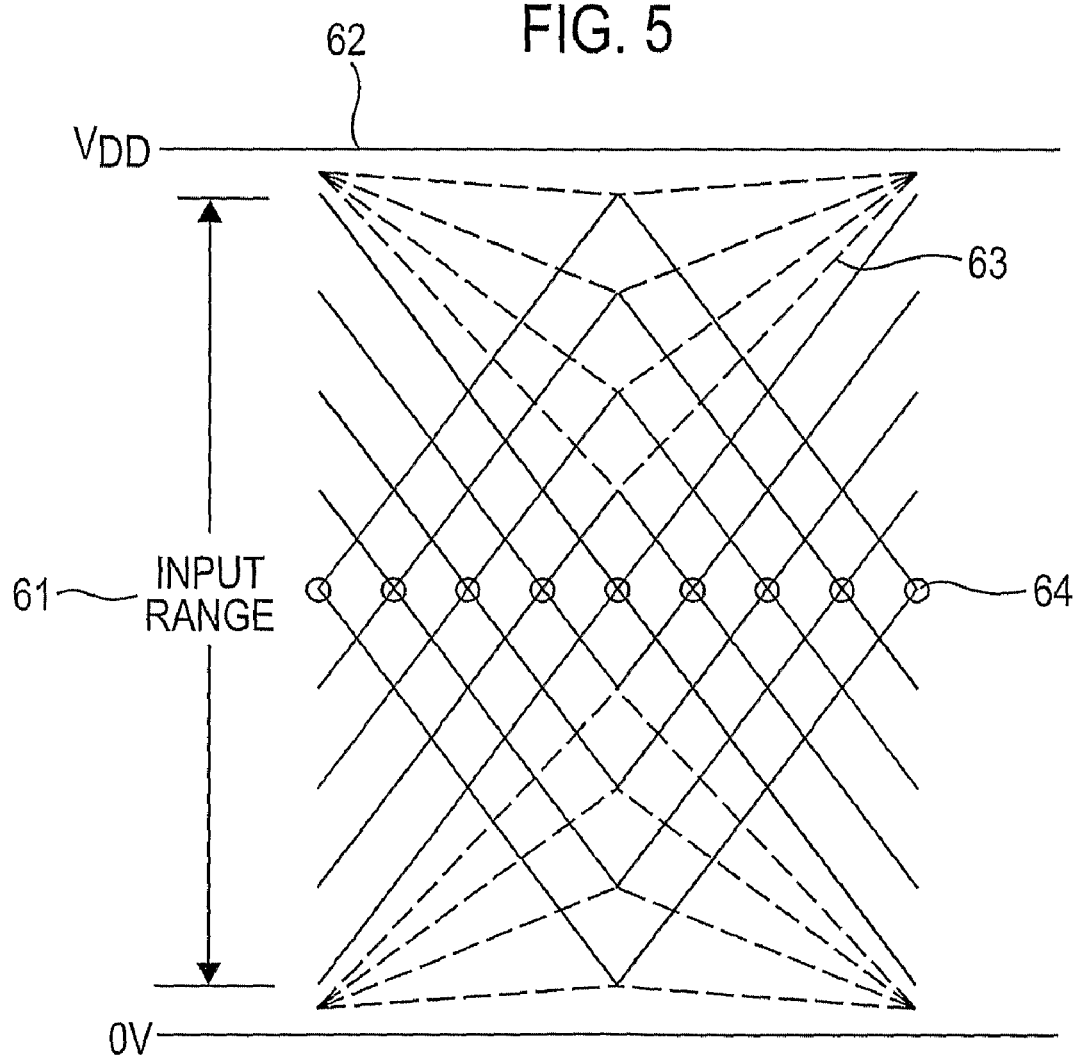
FIG. 5 illustrates the input range of a FLASH ADC in accordance with a first embodiment of the present disclosure.

FIG. 5 illustrates the input range of the ADC shown in FIG. 4. The input range 61 is almost the entire rail-to-rail voltage range—approximately double the input range of the ADC shown in FIG. 2. As the input voltages approach the rail voltages 62 and 65, the delta-voltages across the resistors nearest the rails "compress" and the voltages at the corresponding nodes are no longer accurate. However, as explained below, this does not affect the accuracy of the conversion by the ADC. In FIG. 5, the node voltages are shown as dashed lines 63 when "compressing".

The circles 64 represent the crossover points at the threshold of each bit value, i.e. each point corresponds to the voltage at which the output of a given comparator switches from low to high or vice versa. Note that the threshold voltage is the same for all the comparators.

Compression occurs when an input voltage becomes sufficiently close to one of the rail voltages that the relevant current source and current sink cannot maintain the constant current through the resistor chain. In other words, the voltage dropped across the current source/sink closest in voltage to the input is at a minimum and so the voltage across the resistors between the input and that current source/sink must drop. The voltages at each of the nodes between the input and current source/sink therefore become closer together, or "compressed".

However, because the resistor chains may draw some current from the driving amplifier (not shown) providing the inputs 43 and 50, the delta-voltages do not become "stretched" at the nodes between the input and the current source/sink furthest in voltage from the input. In other words, that current source/sink draws current from the input so as to maintain the correct delta-voltages between the input and that current source/sink. The nodes at which the delta-voltages are compressed feed the inputs of comparators that are far from their threshold: i.e. their first input voltage is either much higher or much lower than their second input voltage and hence a small variation in the ADC input voltage will not cause the output of those comparators to switch. It is the comparators which are close to their threshold that are relevant in the analog-to-digital conversion process, and those comparators take their inputs from the nodes at which compression does not occur. The ADC therefore continues to provide an accurate conversion as the ADC input voltages approach the rail voltages.

The input range 61 is slightly less than the full rail-to-rail voltage range because the current sources and sinks require a minimum voltage across them in order to maintain the current at its predetermined level. As may be seen from FIG. 5, when compression occurs the voltage across the current source/sink adjacent to the compressed nodes does drop below this "minimum" because the MOSFET (or other suitable transistor) controlling the current is driven into linear mode (the drain-source voltage is insufficient to keep the MOSFET saturated). However, as discussed above, this does not extend the ADC input voltage range because only the comparators that take their inputs from uncompressed nodes are relevant in the conversion process.

Figure 1:
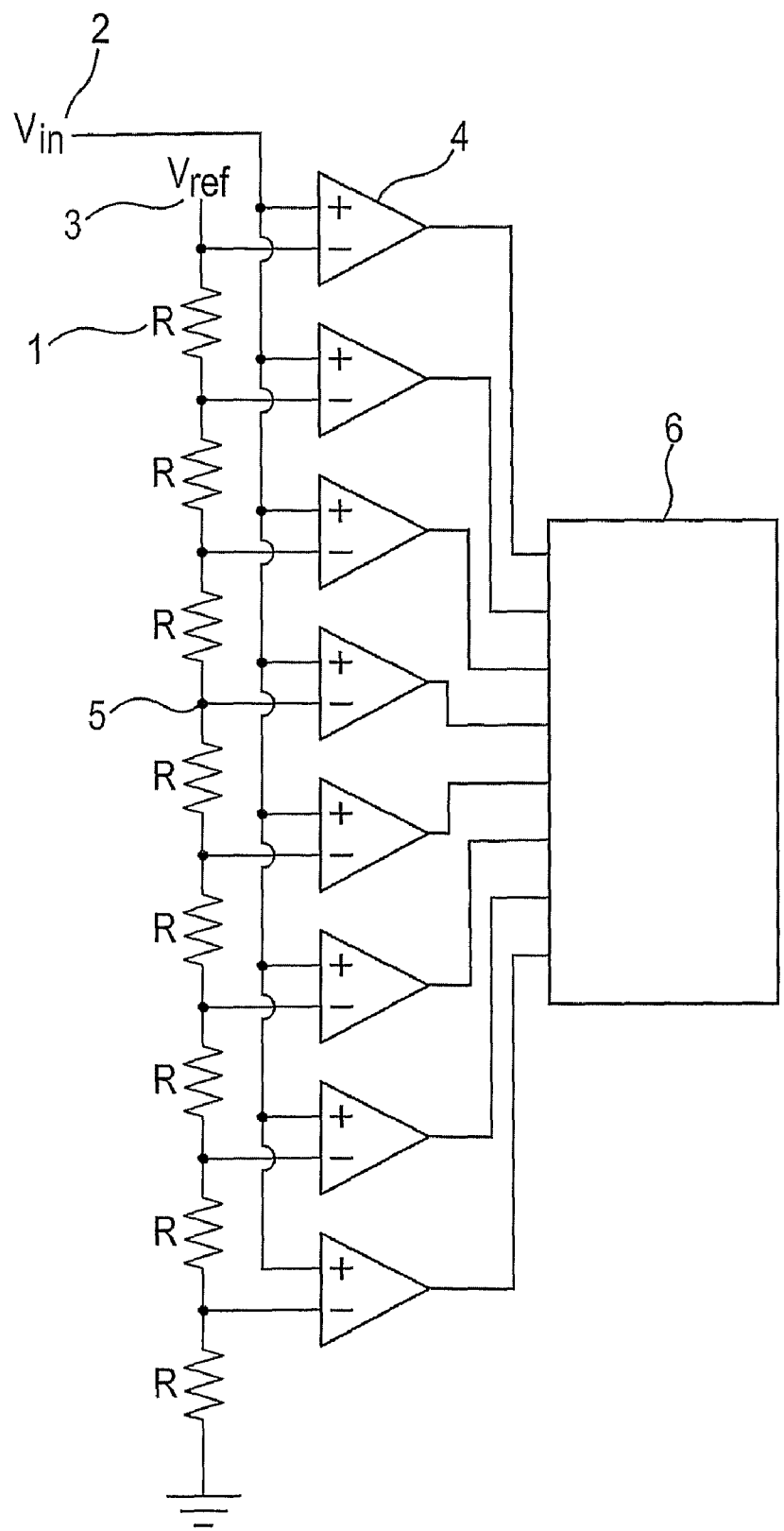
FIG. 1 is a circuit diagram of a conventional FLASH ADC.
Figure 2:
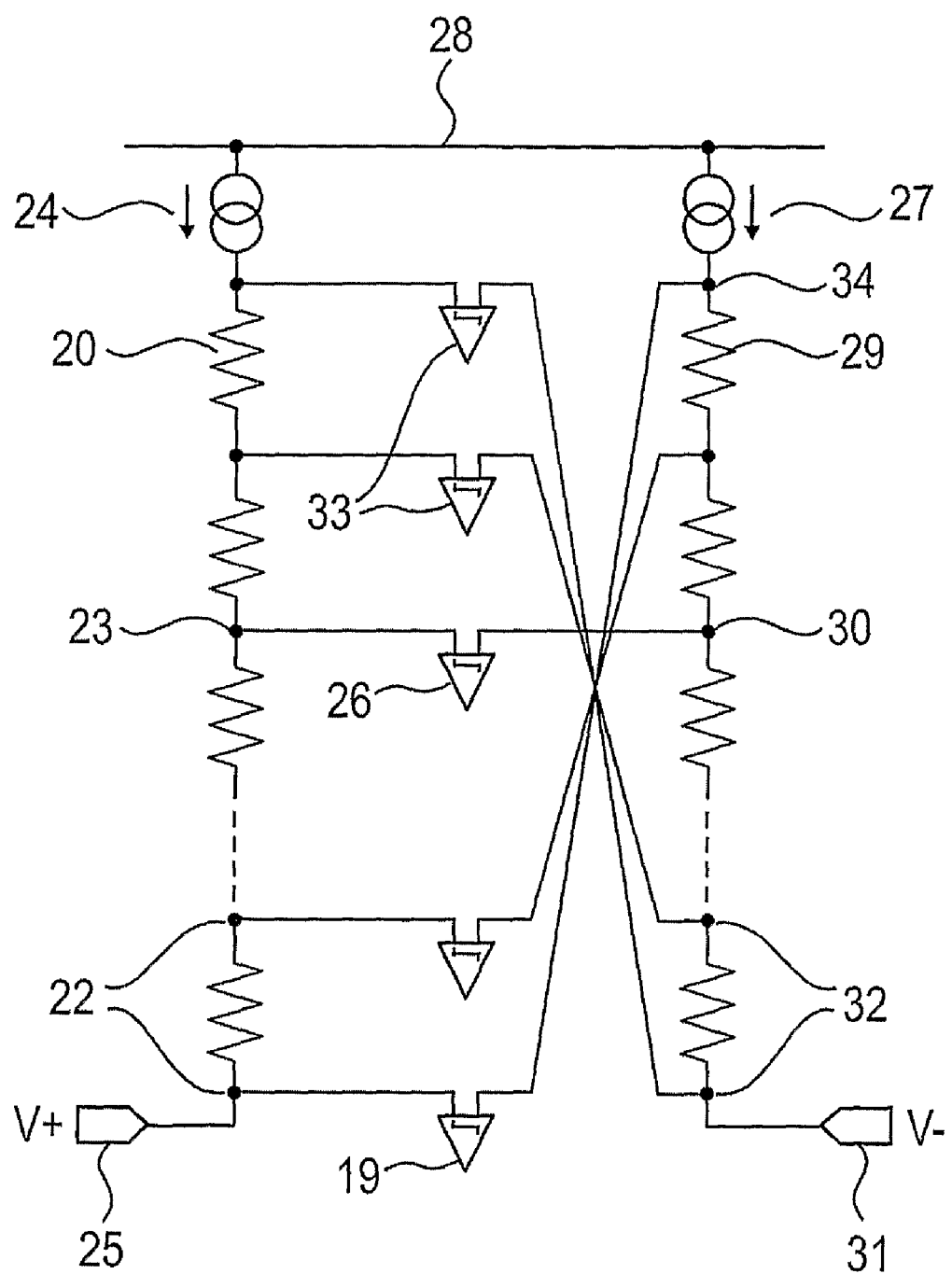
FIG. 2 is a circuit diagram of a differential-input FLASH ADC.
Figure 3:
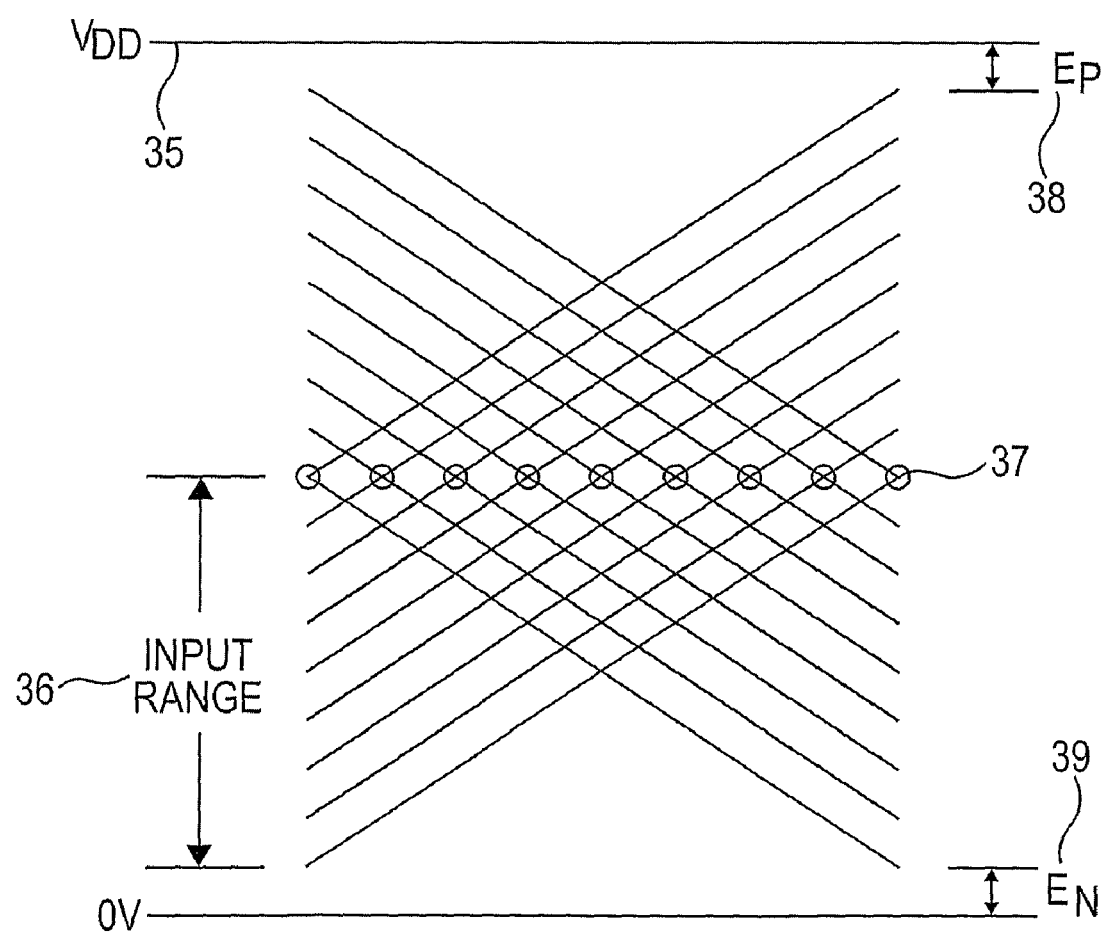
FIG. 3 illustrates a typical input range of the differential-input FLASH ADC shown in FIG. 2.

Using the terminology of FIG. 3, if $E_P$ is the drain-source voltage required to keep each current source saturated, $E_N$ is the drain-source voltage required to keep each current sink saturated, and $V_{DD}$ is the rail voltage 62, then the ADC input voltage range is at most $V_{DD}-E_P-E_N$. This is twice the input range of the ADC shown in FIG. 2.

Considering a preferred embodiment shown in FIG. 4, the advantages of the present disclosure may be most easily appreciated. Firstly, because of the way in which the comparator inputs are taken from opposite ends of the resistor chain, the common-mode comparator input voltage at the threshold of each bit is the same. This removes systematic offset effects in the comparator and simplifies its design. Secondly, because the differential inputs to the ADC are connected at the nodes at the midpoints of the first and second chains there are comparators connected so as to sample the voltages generated at the nodes both above and below the inputs. This allows the ADC to convert input voltages over almost the entire rail-to-rail voltage range. It will be apparent to the skilled person that many of these advantages are present in other embodiments of the present disclosure.

Since the total voltage drop across each resistor chain defines the ADC input voltage range, the resistor values and the current level through the resistors are preferably chosen so that the total voltage drop across each resistor chain in the absence of any inputs is approximately $V_{DD}-E_P-E_N$. This can be understood by considering the effect of a high voltage at input 43 relative to input 50, such that the output of all the comparators is high with the exception of comparator 56. A high input voltage 43 pulls up the voltages at the nodes in the first chain 42, and a low input voltage 50 pulls down the voltages at the nodes in the second chain 48. This causes the voltages at the nodes between input 43 and current source 40, and between input 50 and current sink 47, to compress. When the input voltage 43 increases sufficiently to pull the voltage at node 57 up above the voltage at node 58 the output of comparator 56 will go high. At this point the voltage at node 57 has been pulled up to, and the voltage at node 58 has been pulled down to, the voltage level halfway between the rail voltages 46 and 53 (i.e. the voltage at the midpoint nodes 44 and 49 in the absence of any inputs). This is the threshold voltage at which all the comparators switch (shown by crossover points 64 in FIG. 5). Since comparator 56 is the last in the series, the voltage by which node 57 is pulled up is the highest input voltage that can be digitally represented. By an analogous consideration of the effect of a low voltage at input 43 relative to input 50, it can be seen that the total ADC input voltage range is defined by the total voltage drop across each resistor chain in the absence of any inputs.

An ADC operating in accordance with the present nondisclosure has an input range almost as wide as the rail-to-rail voltage. The ADC therefore has a greater tolerance to offset voltages caused by its internal components (such as resistors and comparators) than an ADC having a smaller input range. This allows the internal components to be designed to use less silicon area, making the ADC more economical and easier to integrate with low voltage digital electronics. Furthermore, the ability of the ADC to utilize almost the full rail-to-rail voltage range allows it to convert input signals over the same input range as, but operate at lower supply voltages than, conventional ADCs.

Figure 6:
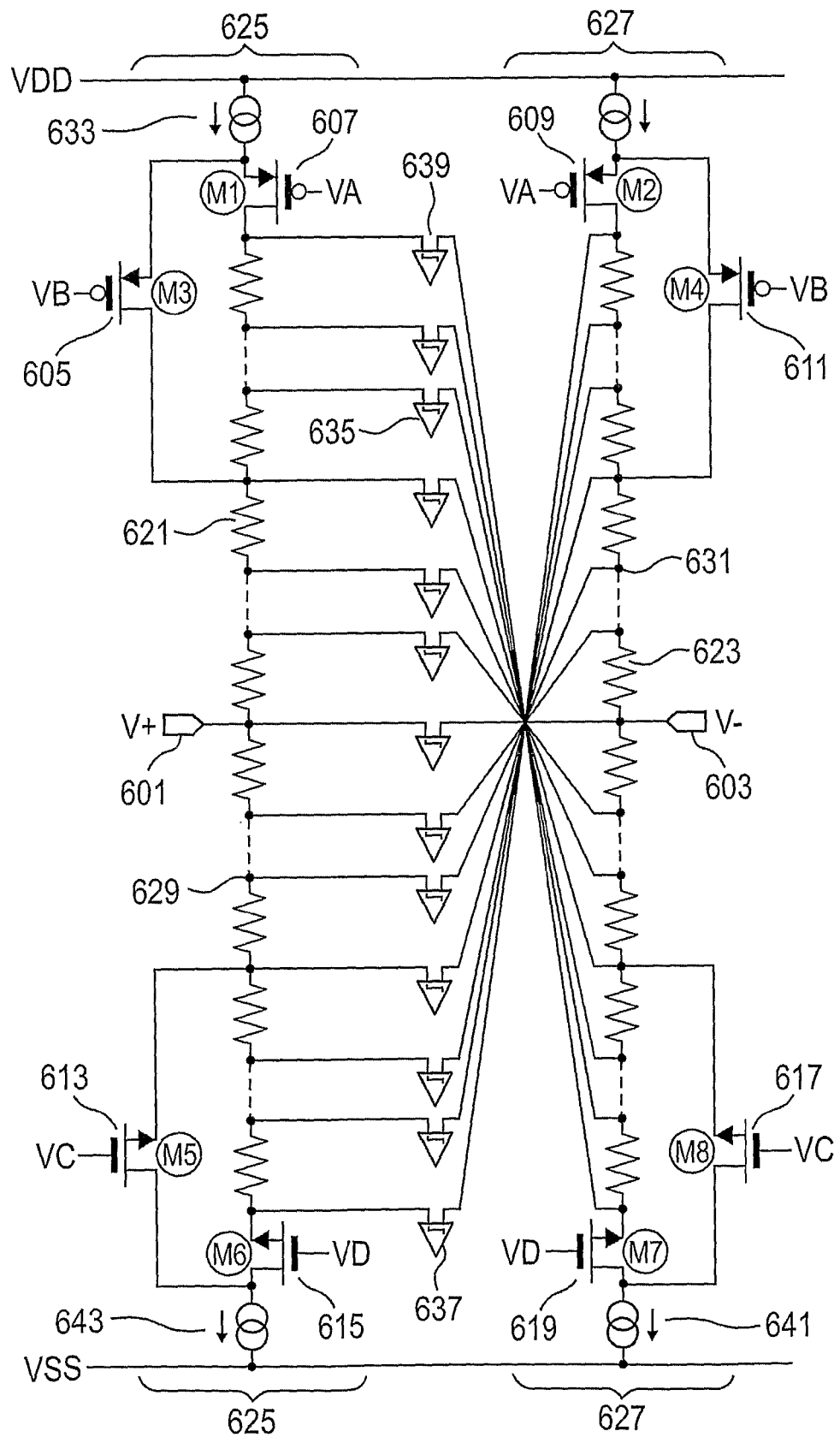
FIG. 6 is a circuit diagram of a FLASH ADC in accordance with a second embodiment of the present disclosure.

FIG. 6 shows a FLASH ADC circuit having differential inputs 601 and 603. The basic configuration of resistors, comparators, and current sources and sinks is the same as in FIG. 4. A set of comparators 635 compares the voltages at a first set of nodes forming a first chain 629 with the voltages at a second set of nodes forming a second chain 631. The circuit shown in FIG. 6 further includes chain transistors 607, 609, 615 and 619, and bypass transistors 605, 611, 613 and 617. The transistors may be any suitable type of switching device and are not limited to being transistors or, as described in relation to FIG. 6, MOSFETs. The circuit may have any combination of the features, and may be configured in any of the variations, described above in relation to FIG. 4. The circuit may receive its inputs from input circuitry (not shown), which may have any of the characteristics of the input circuitry described in relation to FIG. 4.

Transistors 605 through 611 are PMOS devices, and transistors 613 through 619 are NMOS devices, though it will be understood that any suitable switching devices may be used and configured to provide the advantages of the present disclosure. In a preferred embodiment, transistors 605 and 607 operating in the first corner of the circuit are nominally identical to transistors 609 and 611 operating in the second corner of the circuit; likewise for transistor pairs 613, 615 and 617, 619, operating in the third and fourth corners respectively. It is further preferable that resistor chains 621 and 623 are nominally identical.

In a preferred embodiment, transistors 605 and 607 are chosen to have nominally equivalent characteristics to transistors 613, 615, respectively; likewise for transistor pairs 609, 611 and 617, 619. In this embodiment, the components above input 601 in component chain 625 are the "mirror image" of the components below input 601 in component chain 625; likewise for component chain 627. Generally, it is convenient to choose that the transistors above the inputs 601 and 603 are p-type transistors and that the transistors below the inputs 601 and 603 are n-type transistors, as shown in FIG. 6.

The advantages of the present disclosure may be most easily appreciated by considering the embodiment shown in FIG. 6, with the resistors in chains 621 and 623 all having the same nominal value. In the absence of transistors 605 through 619 the circuit will operate in the same way as the circuit shown in FIG. 4 and as described above. For the purposes of the discussion below, and in FIG. 6, the transistors in each pair (i.e. 605 and 607, or 617 and 619) are assumed to be identical. However, the transistors of each pair may be of different types or have different characteristics, providing the gate voltages are suitably selected such that the chain transistors switch OFF at the appropriate voltage. Indeed, there are advantages to arranging that the bypass transistors have different channel characteristics to the chain transistors so as help current to preferentially flow through the chain transistors when both transistors are ON in a given corner of the circuit.

Consider the first corner of the circuit in FIG. 6 that includes PMOS transistors 605 and 607 (which will now be referred to as transistors M1 and M3, respectively). When the input voltage 601 is high, the voltages at the nodes between input 601 and the upper voltage rail are pushed upwards and thus the voltages at the drains of M1 and M3 approach the voltage at the sources of M1 and M3. In other embodiments, the voltages at the sources of M1 and M3 (and likewise for the three other corners of the circuit) need not be the same.

Voltages VA and VB are maintained at the gates of M1 and M3, respectively. In a preferred embodiment these voltages are fixed. The state of switches M1 and M3 is therefore largely determined by their source-drain voltage. VA is chosen to be lower than VB so that the saturation drain current of VA is higher than VB and current will preferentially flow through M1 when both M1 and M3 are ON. Corresponding gate voltages are maintained at the gates of the other transistor pairs. The saturation drain current of M3 need not be higher than the fixed target current of the current sources and sinks if the driving amplifier feeding the inputs to the ADC circuit can provide adequate current to maintain the correct delta-voltages across the resistors between the nodes which are close to the threshold voltage.

At a sufficiently high input voltage, the voltage at the drain of chain transistor M1 will be high enough to turn OFF M1. The current from current source 633 will therefore flow through bypass transistor M3, bypassing the resistors between the drains of M1 and M3. The current through M3 may be limited by the saturation drain current that M3 can provide given its gate voltage VB. The voltages at the nodes between those resistors which have been bypassed, and—if M3 limits the current from the current source—the voltages at the nodes between the input and the drain of M3, will no longer be evenly spaced. However, as was noted in relation to FIG. 4, the accuracy of the voltages at the nodes away from the threshold voltage does not affect the accuracy of the analog-to-digital conversion process.

At the other end of component chain 625, the source-drain voltage of chain transistor M6 will be large and therefore M6 will be ON when the input voltage is high. Since the current through the resistors between input 601 and current sink 643 is kept constant, the delta-voltages across the resistors will be fixed and evenly spaced and the voltages at the nodes between the input and current sink will be accurate.

Inputs 601 and 603 are differential inputs and input voltage 601 will preferably be equal but opposite in sign to input voltage 603. The ADC is therefore configured such that chain transistors M1 and M7 will switch off at the same point when input voltage 601 becomes sufficiently high and input voltage 603 becomes correspondingly sufficiently low. Likewise for chain transistors M2 and M6 when input voltage 601 becomes sufficiently low and input voltage 603 becomes correspondingly sufficiently high.

Bypassing the resistors between the drains of M1 and M3 (and correspondingly the resistors between the drains of M7 and M8) reduces the total resistance between the current source 633 and input 601 (and current sink 641 and input 603) and makes it possible for the ADC to convert input voltages up to the upper rail voltage $V_{DD}$. This is achieved by arranging that the last comparator 637 switches when input voltage 601 pulls up the voltages at nodes 629 by half the rail-to-rail voltage and input voltage 603 pulls down the voltages at nodes 631 by half the rail-to-rail voltage. In other words, the nodes feeding the inputs of the last comparators are arranged to meet the threshold voltage when ADC inputs 601 and 603 reach the upper and lower rail voltages respectively.

At a sufficiently low input voltage, the NMOS transistor pair 613 (M5) and 615 (M6) will behave in an analogous manner to M1 and M3: chain transistor M6 will turn OFF and the current will flow through bypass transistor M5, bypassing the resistors between the drains of M5 and M6. Correspondingly, M2 will turn OFF and the current will flow through M4, bypassing the resistors between the drains of M2 and M4. By arranging for the first comparator 639 to switch when input voltage 601 pulls down the voltages at nodes 629 by half the rail-to-rail voltage and input voltage 603 pulls up the voltages at nodes 631 by half the rail-to-rail voltage, the ADC can convert input voltages down to the lower rail voltage $V_{SS}$.

At an intermediate input voltage, all the transistors will be ON and almost all the current will go through chain transistors M1, M2, M6 and M7 in preference to bypass transistors M3, M4, M5 and M8. This is because—taking the first component chain 625 as an example—the gate voltage of transistor M1 is much lower than of M3 (a PMOS pair) and the gate voltage of transistor M6 is much higher than of M5 (an NMOS pair). In other words, at intermediate input voltages the circuit behaves in essentially the same manner as the circuit shown in FIG. 4.

In other embodiments, the control voltages (the gate voltages as described in relation to the MOSFETs of FIG. 6) of the switching device pairs may not be fixed. The control voltages may be at least partially dependent on the relevant input voltage. For example, the gate voltage of a chain transistor may fall as the relevant input voltage approaches the predetermined level at which that chain transistor turns OFF: such an arrangement may help to improve the ON/OFF characteristics of the chain transistors. Furthermore, the gate voltage of a bypass transistor may rise as the relevant input voltage approaches the predetermined level at which the relevant chain transistor turns OFF: this may help to ensure that the bypass transistor can pass the full current supplied by the relevant current source or sink. It is also desirable to adjust the gate voltages with the aim of ensuring that, when both the chain transistor and bypass transistor of a transistor pair are ON, the current from the relevant current source or sink flows almost exclusively through the chain transistor.

Figure 7:
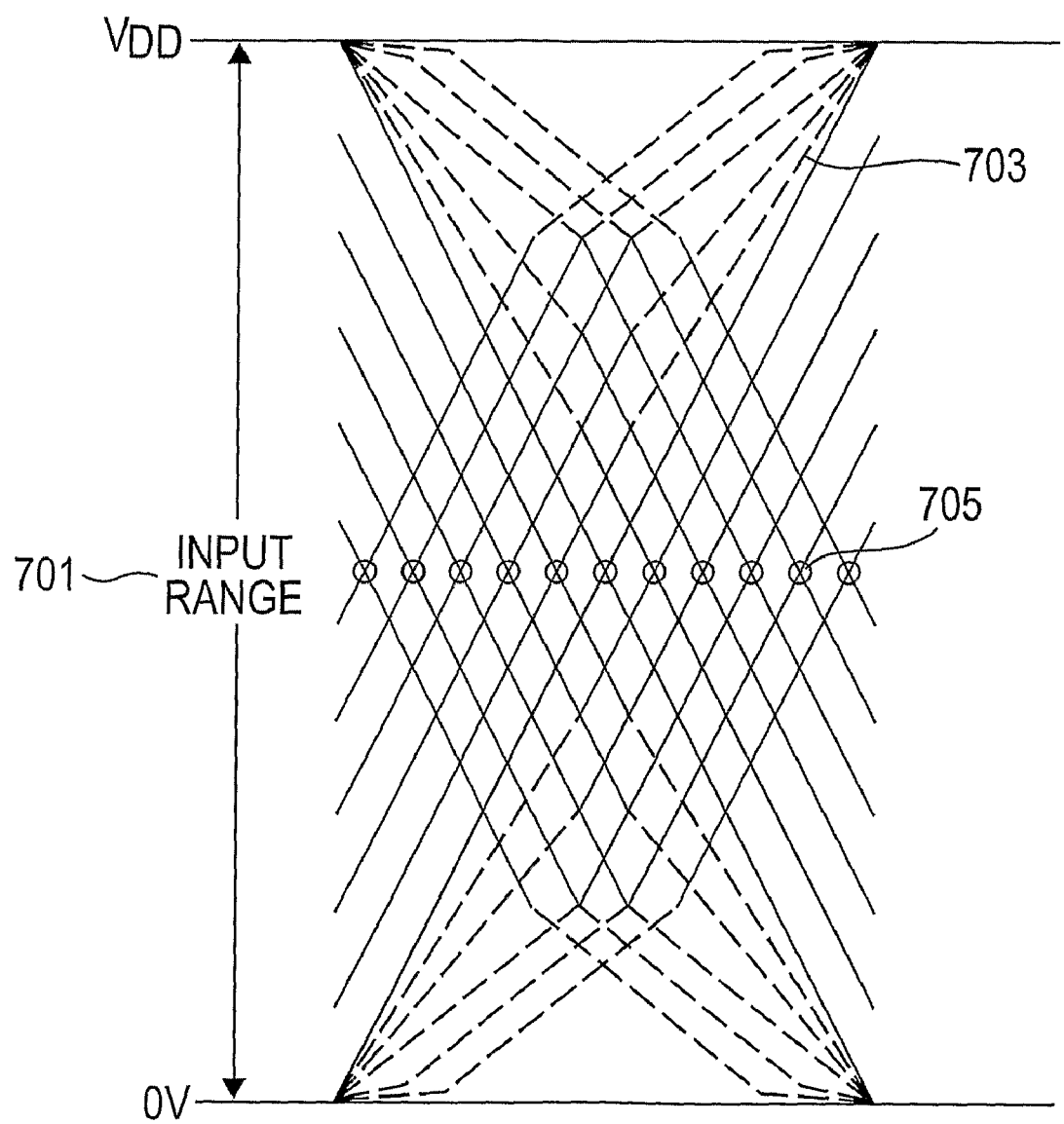
FIG. 7 illustrates the input range of a FLASH ADC in accordance with a second embodiment of the present disclosure.

FIG. 7 illustrates the input range of the ADC shown in FIG. 6. The input range 701 is the entire rail-to-rail voltage range. As the input voltages approach the rail voltages, the circuit exhibits similar compression of delta-voltages across the resistors nearest the rails as does the circuit in FIG. 4. However, as explained above, this does not affect the accuracy of the conversion by the ADC. The node voltages are shown as dashed lines 703 when "compressing".

The circles 705 represent the crossover points at the threshold of each bit value, i.e. each point corresponds to the voltage at which the output of a given comparator switches from low to high or vice versa. Note that the threshold voltage is the same for all the comparators.

The transistor pairs in each "corner" of the circuit shown in FIG. 6 allow the ADC to accurately operate over an input range that is equal to the entire rail-to-rail supply voltage. In comparison to the ADC shown in FIG. 4, the input range is not limited by the current sources or sinks, which require a certain minimum voltage across them to stay saturated. An ADC operating in accordance with the principles illustrated in FIG. 6 can correctly convert input voltages equal to the rail voltages because, as an input voltage approaches one of the rail voltages, some of the resistors between the input and that rail are bypassed allowing the input voltage to move closer to the rail voltage.

The principles described herein may be applied to many differential and single-ended direct conversion ADC designs, and are not limited to the circuit shown in FIG. 6. The transistor pairs may be on only one of the component chains 625 and 627. This may be preferable if the signal to be converted at the first input node is single-ended and the voltage at the second input node is fixed: there would be no benefit in employing a transistor pair in the second chain of nodes. As described in relation to FIG. 4, the nodes may be separated by components other than resistors and the voltages at those nodes need not be evenly spaced above and below the relevant input voltage.

The nodes need not be arranged in chains and may be a set of nodes defined by the circuitry of the ADC, each node being at a different voltage between an input voltage and a rail voltage. However, there should be some mechanism for an input voltage to directly or indirectly influence the voltages at the nodes in the relevant set as the input voltage varies, allowing the comparators to measure this variation. In such embodiments of the present disclosure, the transistor pairs are implemented such that as the relevant input voltage approaches a rail voltage the "chain" transistor of the pair (which feeds current to all nodes of the set) turns OFF, causing current from the relevant current sources/sinks to pass through a bypass transistor, which bypasses selected ones of those nodes which are closest in voltage to the rail voltage and supplies current only to those other nodes which are not to be bypassed.

Figure 8:
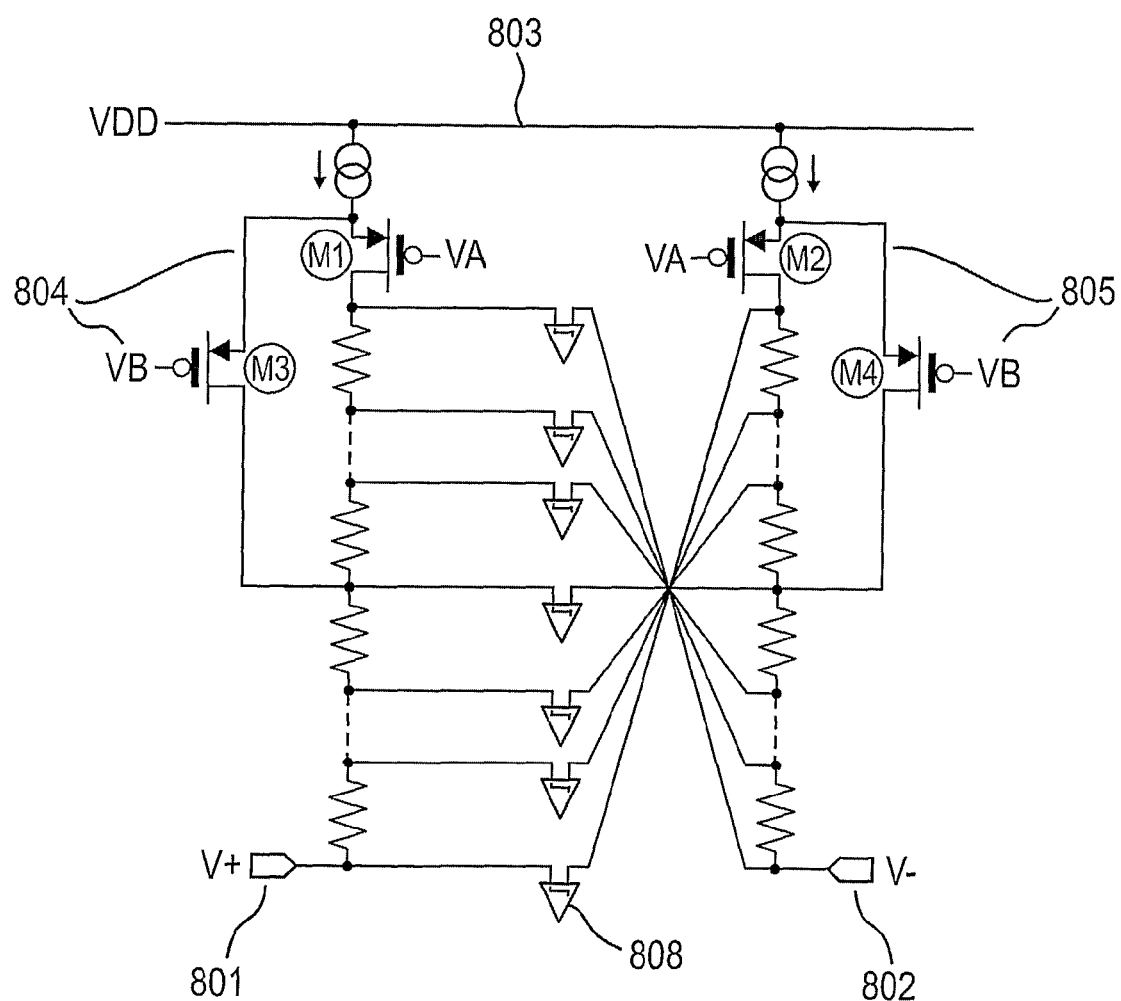
FIG. 8 is a circuit diagram of a FLASH ADC in accordance with an alternative embodiment of the present disclosure.
Figure 9:
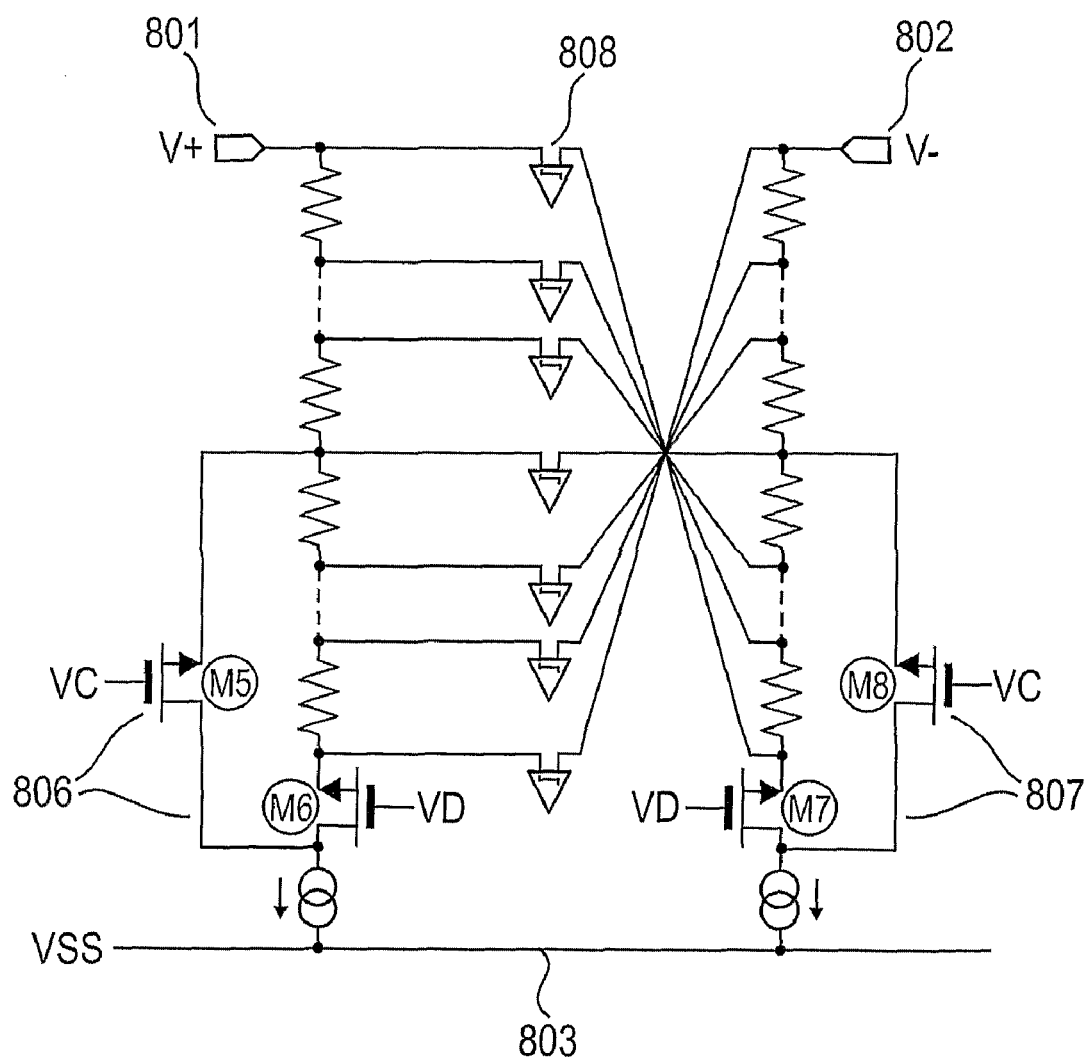
FIG. 9 is a circuit diagram of a FLASH ADC in accordance with another alternative embodiment of the present disclosure.

FIGS. 8 and 9 show alternative embodiments of the present disclosure in which principles of the present disclosure are applied to the circuit shown in FIG. 2. In FIGS. 8 and 9, the circuitry of an analog to digital converter is arranged between inputs 801 and 802 and a single voltage rail 803. Transistor pairs 804 and 805 in FIG. 8, and 806 and 807 in FIG. 9, operate in the same manner as the transistor pairs shown in FIG. 6. When either input voltage becomes sufficiently close to the rail voltage, the chain transistor of the corresponding transistor pair will turn OFF and all current will pass through the bypass transistor (using the terminology defined above in relation to FIG. 6). By arranging for the final comparator 808 to switch when the input voltage 801 reaches the rail voltage, the analog to digital converters shown in FIGS. 8 and 9 can convert voltages all the way up to (or down to) the rail voltage 803.

Since the input voltages are applied at the ends of the resistor chains in the circuits shown in FIGS. 8 and 9, those circuits can use only half the available rail-to-rail voltage range. However, unlike the circuit in FIG. 2, the circuits in FIGS. 8 and 9 can operate over an input range equal to the full half rail-to-rail voltage.

In accordance with the principles of the present disclosure, a set of nodes and the voltages thereat may be defined by any suitable collection of components. The nodes need not be configured as a chain in which adjacent nodes are coupled together by one or more components with one or both ends of the chain being coupled to a voltage rail. For example, each node may be individually coupled to at least one voltage rail by one or more components across which there is a potential drop. It will be evident to a person skilled in the art that a direct conversion ADC in accordance with the principles of the present disclosure may be configured with the voltages on the nodes of the first and second sets arranged in any kind of progression such that a set of comparators can be connected between nodes of the first set and nodes of the second set and arranged so that at least some of the comparators switch at different input voltages within the desired input range. It will therefore be apparent that spatially or diagrammatically adjacent nodes need not also be adjacent in voltage.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present disclosure may consist of any such individual feature or combination of features. In view of the foregoing description it will be evident to a person skilled in the art that various modifications may be made within the scope of the disclosure.

The invention claimed is:

1. An analog to digital converter comprising:
    a first set comprising nodes defined by circuitry such that each node is at a respective voltage, the voltages on the nodes being in an orderly progression between the voltage of a first current source and the voltage of a first input node;
    a second set comprising nodes defined by circuitry such that each node is at a respective voltage, the voltages on the nodes being in an orderly progression between the voltage of a second current source and the voltage of a second input node;
    a plurality of comparators, each comparator being arranged to compare the voltage on a node in the first set with the voltage on a respective node in the second set; and
    a pair of switching devices arranged between the first current source and the first set of nodes, the first switching device of the pair connected so as to supply the current from the first current source to all said nodes in the first set, and the second switching device of the pair connected so as to supply the current from the first current source to a subset of said nodes in the first set which are closest in voltage to the voltage of the first input node;
    wherein control voltages of the first and second switching devices of the pair are set such that:
    (a) when the potential difference between the voltage at the first current source and the voltage at the first input node is greater than a predetermined potential difference the first switching device is in a first state and the current from the first current source flows through the first switching device; and
    (b) when the potential difference between the voltage at the first current source and the voltage at the first input node is less than the predetermined potential difference the first switching device is in a second state and the current from the first current source flows through the second switching device.

2. An analog to digital converter as claimed in claim 1, wherein the circuitry is arranged such that, in the absence of input voltages at the first and second input nodes, the voltages on the nodes in the first and second sets are in a linear progression.

3. An analog to digital converter as claimed in claim 1, wherein the circuitry is arranged such that, in the absence of input voltages at the first and second input nodes, the voltages on the nodes in the first and second sets are in a logarithmic progression.

4. An analog to digital converter as claimed in claim 1, wherein the circuitry is arranged such that the first set of nodes form a chain of first nodes extending between the first current source and first input node and the second set of nodes form a chain of second nodes extending between the second current source and second input node, each pair of adjacent nodes in the first and second chains of nodes being interconnected by a set of one or more resistors.

5. An analog to digital converter as claimed in claim 4, wherein each set of one or more resistors interconnecting the pairs of adjacent nodes in the first and second chains of nodes has the same total nominal resistance.

6. An analog to digital converter as claimed in claim 4, wherein the total nominal resistance of each set of one or more resistors and the target current level of the current sources and sinks are chosen so as to maximize the input voltage range of the analog to digital converter.

7. An analog to digital converter as claimed in claim 1, further comprising:
    a second pair of switching devices arranged between the second current source and the second set of nodes, the first switching device of the pair connected so as to supply the current from the second current source to all said nodes in the second set, and the second switching device of the pair connected so as to supply the current from the second current source to a subset of said nodes in the second set closest in voltage to the voltage of the second input node;
    wherein the control voltages of the first and second switching devices of the second pair are such that:
    (a) when the potential difference between the voltage at the second current source and the voltage at the second input node is greater than a predetermined potential difference the first switching device is in a first state and the current from the second current source flows through the first switching device;
    (b) when the potential difference between the voltage at the second current source and the voltage at the second input node is less than the predetermined potential difference the first switching device is in a second state and the current from the second current source flows through the second switching device.

8. An analog to digital converter as claimed in claim 1, wherein the control voltages are invariant during operation.

9. An analog to digital converter as claimed in claim 1, wherein the switching devices are transistors and the control voltages are gate voltages.

10. An analog to digital converter as claimed in claim 9, wherein the magnitude of the difference between the gate voltage of a first transistor of a pair and its threshold voltage is greater than the magnitude of the difference between the gate voltage of a second transistor of that pair and its threshold voltage.

11. An analog to digital converter as claimed in claim 1, further comprising input circuitry arranged to provide first and second input voltages to the first and second input nodes.

12. An analog to digital converter as claimed in claim 11, wherein the input circuitry includes one or more driving amplifiers configured such that the first and second input voltages are substantially independent of the current provided to the first and second input nodes by the input circuitry.

13. An analog to digital converter as claimed in claim 11, wherein the first and second input voltages are scaled so that the maximum and minimum input voltages are equal to the voltages delimiting the input voltage range of the analog to digital converter.

14. An analog to digital converter as claimed in claim 11, wherein the first and second input voltages are biased such that the midpoint voltage between the two input voltages is maintained at the midpoint voltage between the upper and lower supply voltages supplied to the analog to digital converter.

15. An analog to digital converter as claimed in claim 1, wherein the first and second input voltages are a pair of differential input voltages.

16. An analog to digital converter as claimed in claim 11, wherein the first input voltage is a single-ended input voltage and the second input voltage is synthesized from the first input voltage so as to maintain the midpoint voltage between the two input voltages at the midpoint voltage between the upper and lower supply voltages supplied to the analog to digital converter.

17. An analog to digital converter as claimed in claim 1, wherein the first and second sets of nodes each have N nodes and a comparator having its first input connected to the node at position x in the first set has its second input connected to the respective node at position N+1−x in the second set, where x=1 at the nodes adjacent to the first and second current sources and x=N at the nodes adjacent to the first and second input nodes and the remaining nodes in each set are arranged in successive order therebetween.

18. An analog to digital converter as claimed in claim 1, the first set of nodes further comprising a further set of first nodes defined by circuitry such that each node is at a respective voltage, the voltages on the further set of first nodes being in an orderly progression between the voltage of the first input node and the voltage of a first current sink; and the second set of nodes further comprising a further set of second nodes defined by circuitry such that each node is at a respective voltage, the voltages on the further set of second nodes being in an orderly progression between the voltage of the second input node and the voltage of a second current sink;
the analog to digital converter further comprising:
  a third pair of switching devices arranged between the first current sink and the further set of first nodes, the first switching device of the pair connected so as to supply the current from the first current sink to all the nodes in the further set of first nodes, and the second switching device of the pair connected so as to supply the current from the first current sink to a subset of the nodes in the further set of first nodes which are closest in voltage to the voltage of the first input node;
wherein the control voltages of the first and second switching devices of the third pair are such that:
  (a) when the potential difference between the voltage at the first current sink and the voltage at the first input node is greater than a predetermined potential difference the first switching device is in a first state and the current from the first current source flows through the first switching device; and
  (b) when the potential difference between the voltage at the first current sink and the voltage at the first input node is less than the predetermined potential difference the first switching device is in a second state and the current from the first current source flows through the second switching device.

19. An analog to digital converter as claimed in claim 18, further comprising a comparator arranged to compare the voltage at the first input node with the voltage at the second input node.

20. An analog to digital converter as claimed in claim 18, further comprising:
  a fourth pair of switching devices arranged between the second current sink and the further set of second nodes, the first switching device of the pair connected so as to supply the current from the second current sink to all the nodes in the further set of second nodes, and the second switching device of the pair connected so as to supply the current from the second current sink to a subset of the nodes in the further set of second nodes which are closest in voltage to the voltage of the second input node;
wherein the control voltages of the first and second switching devices of the fourth pair are such that:
  (a) when the potential difference between the voltage at the second current sink and the voltage at the second input node is greater than a predetermined potential difference the first transistor is in a first state and the current from the second current source flows through the first switching device; and
  (b) when the potential difference between the voltage at the second current sink and the voltage at the second input node is less than the predetermined potential difference the first transistor is in a second state and the current from the second current source flows through the second switching device.

21. An analog to digital converter as claimed in claim 20, wherein the input voltage range is equal to the potential difference between the upper and lower supply voltages supplied to the analog to digital converter.

22. An analog to digital converter as claimed in claim 18, wherein the first and second sets of nodes each have N nodes and the total number of comparators is N, each comparator having its first and second inputs connected such that a comparator having its first input connected to the node at position x in the first set has its second input connected to the node at position N+1−x in the second set, where x=1 at the nodes adjacent to the first and second current sources and x=N at the nodes adjacent to the first and second current sinks and the remaining nodes in each set are arranged in successive order therebetween.

23. An electronic device comprising an analog to digital converter as claimed in claim 1.

24. An integrated circuit comprising an analog to digital converter as claimed in claim 1.

* * * * *